(12) United States Patent
Norimatsu et al.

(10) Patent No.: US 8,633,746 B2
(45) Date of Patent: Jan. 21, 2014

(54) SEMICONDUCTOR DEVICE AND RADIO COMMUNICATION TERMINAL MOUNTING THE SAME

(71) Applicant: Renesas Mobile Corporation, Tokyo (JP)

(72) Inventors: Takayasu Norimatsu, Tokyo (JP); Satoru Yamamoto, Tokyo (JP); Taizo Yamawaki, Tokyo (JP)

(73) Assignee: Renesas Mobile Corporation, Tokyo (JP)

( * ) Notice: Subject to any disclaimer, the term of this patent is extended or adjusted under 35 U.S.C. 154(b) by 0 days.

(21) Appl. No.: 13/654,403

(22) Filed: Oct. 17, 2012

(65) Prior Publication Data

US 2013/0093479 A1 Apr. 18, 2013

(30) Foreign Application Priority Data

Oct. 18, 2011 (JP) ................................. 2011-228728

(51) Int. Cl.
*H03L 7/06* (2006.01)

(52) U.S. Cl.
USPC ............................ 327/156; 327/105; 327/159

(58) Field of Classification Search
USPC .......................................... 327/156, 105, 159
See application file for complete search history.

(56) References Cited

U.S. PATENT DOCUMENTS

| 4,752,749 | A  | * | 6/1988 | Moger ............................. 331/17 |
| 5,047,733 | A  | * | 9/1991 | Nonaka et al. .................. 331/14 |
| 6,784,728 | B2 | * | 8/2004 | Fischer ........................... 327/554 |
| 2008/0069373 | A1 | * | 3/2008 | Jiang et al. .................... 381/94.1 |
| 2010/0019812 | A1 |   | 1/2010 | Tsuda |
| 2010/0272222 | A1 | * | 10/2010 | Mitani et al. .................. 375/376 |

FOREIGN PATENT DOCUMENTS

JP          2010-34618 A          2/2010

* cited by examiner

*Primary Examiner* — Long Nguyen
*Assistant Examiner* — Patrick Chen
(74) *Attorney, Agent, or Firm* — Miles & Stockbridge P.C.

(57) ABSTRACT

A phase detector, which forms a semiconductor device, detects a phase difference between a reference signal and a feedback signal obtained by feeding back an output signal of an oscillator, and generates a phase difference value indicating a value in accordance with the phase difference. An amplifier amplifies the phase difference value at a gain determined in accordance with a control signal from outside the device. A filter smoothes an output value of the amplifier. The oscillator controls a frequency of the output signal in accordance with an output value of the filter.

8 Claims, 11 Drawing Sheets

SEMICONDUCTOR DEVICE AND RADIO COMMUNICATION TERMINAL MOUNTING THE SAME

CROSS-REFERENCE TO RELATED APPLICATIONS

This application is based upon and claims the benefit of priority from Japanese patent application No. 2011-228728, filed on Oct. 18, 2011, the disclosure of which is incorporated herein in its entirety by reference.

BACKGROUND

The present invention relates to a semiconductor device and a radio communication terminal mounting the semiconductor device.

Recently, in a radio communication terminal, there has been used a PLL (Phase Locked Loop) circuit for accurately locking a carrier frequency or the like.

For example, Japanese Unexamined Patent Application Publication No. 2010-34618 discloses a PLL circuit which compensates the offset (fluctuation of an oscillation frequency) occurring upon switching a loop bandwidth. The loop bandwidth means a range of frequencies which the PLL circuit can control.

SUMMARY

The inventors of this application have found various problems to be solved in the development of semiconductor devices. Each embodiment disclosed in this application provides, for example, a semiconductor device suitable for a radio communication terminal and the like. More detailed features will become obvious from descriptions of this specification and attached drawings.

An aspect disclosed in this specification includes a semiconductor device. In this semiconductor device, the gain of an amplifier placed anterior to a filter is variable.

According to the present invention, it is possible to provide an excellent semiconductor device suitable for, for example, a radio communication terminal.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Hereinafter, specific embodiments to which the present invention is applied will be described in detail with reference to the drawings. Note that the same signs are assigned to the same elements throughout the drawings, and their duplicated explanation is omitted as appropriate for clarifying the description.

First Embodiment

Figure 1A:
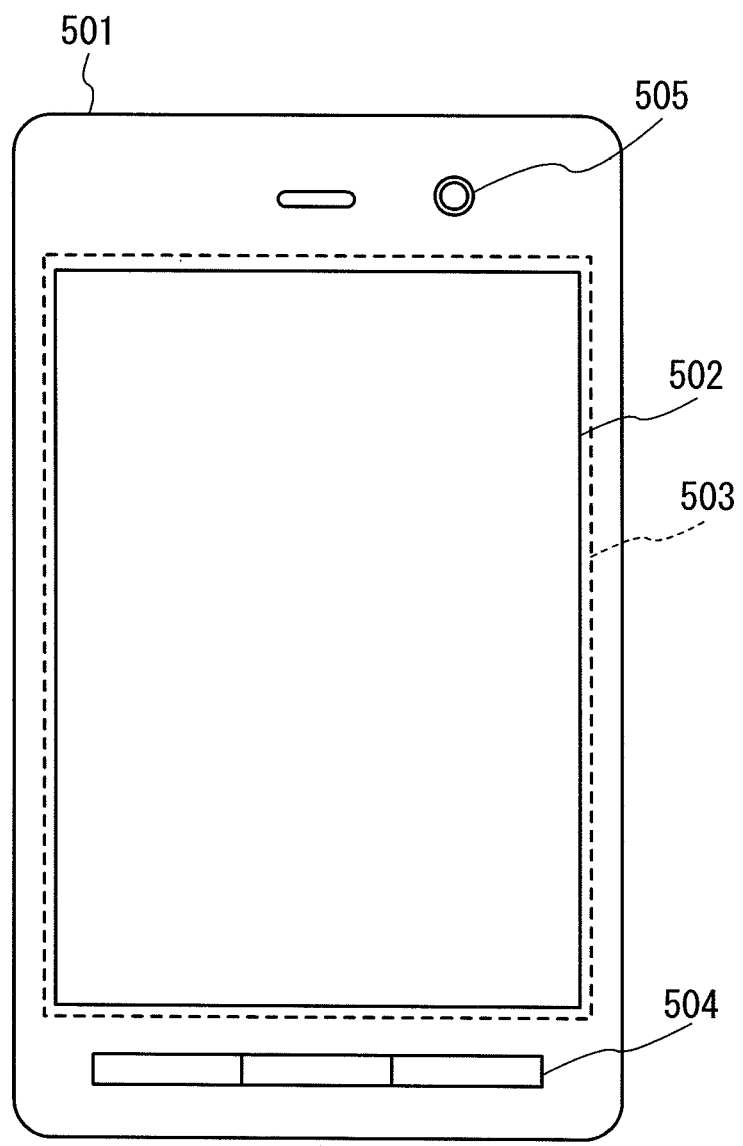
FIG. 1A is one external view showing a configuration example of a radio communication terminal according to a first embodiment of the present invention.
Figure 1B:
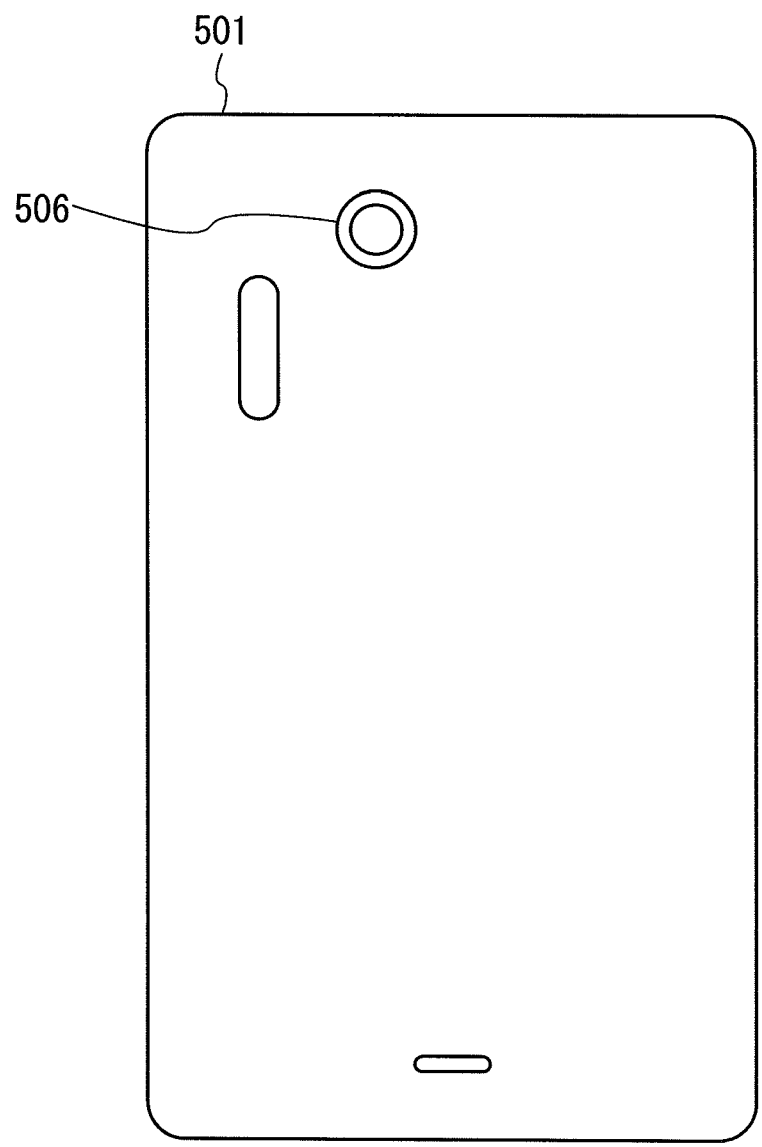
FIG. 1B is another external view showing the configuration example of the radio communication terminal according to the first embodiment.

Firstly, with reference to FIGS. 1A and 1B, there will be described an outline of a radio communication terminal preferable as an electronic device to which a semiconductor device according to this embodiment is applied. FIGS. 1A and 1B are external views showing a configuration example of a radio communication terminal 500. Note that FIGS. 1A and 1B show cases where the radio communication terminal 500 is a smart phone. However, the radio communication terminal 500 may be a different radio communication terminal such as a feature phone (e.g., a folding-type mobile phone terminal), a potable game terminal, a tablet PC (Personal Computer), or a laptop PC. Further, needless to say, the semiconductor device according to this embodiment can be also applied to devices other than the radio communication terminal. For example, the semiconductor device according to this embodiment may be applied to a base station.

FIG. 1A shows one of main surfaces (front surface) of a housing 501 forming the radio communication terminal 500. A display device 502, a touch panel 503, several operation buttons 504 and a camera device 505 are arranged on the front surface of the housing 501. On the other hand, FIG. 1B shows the other one of the main surfaces (rear surface) of the housing 501. A camera device 506 is arranged on the rear surface of the housing 501.

The display device 502 is an LCD (Liquid Crystal Display), an OLED (Organic Light-Emitting Diode) display or the like, and is disposed in such a manner that its display surface is positioned on the front surface of the housing 501. The touch panel 503 is disposed so as to cover the display surface of the display device 502, or disposed on the reverse side of the display device 502, so that the touch panel 503 detects a location touched by a user to the display surface. That is, the user can intuitively operate the radio communication terminal 500 by touching the display surface of the display device 502 with fingers, a special pen (generally referred to as a stylus) or the like. Further, the operation buttons 504 are used for performing auxiliary operation for the radio communication terminal 500. Note that in certain radio communication terminals, such operation buttons are sometimes not arranged.

The camera device 506 is a main camera disposed in such a manner that its lens unit is positioned on the rear surface of the housing 501. On the other hand, the camera device 505 is a sub camera disposed in such a manner that its lens unit is positioned on the front surface of the housing 501. Note that in certain radio communication terminals, such a sub camera is sometimes not arranged.

Figure 2:
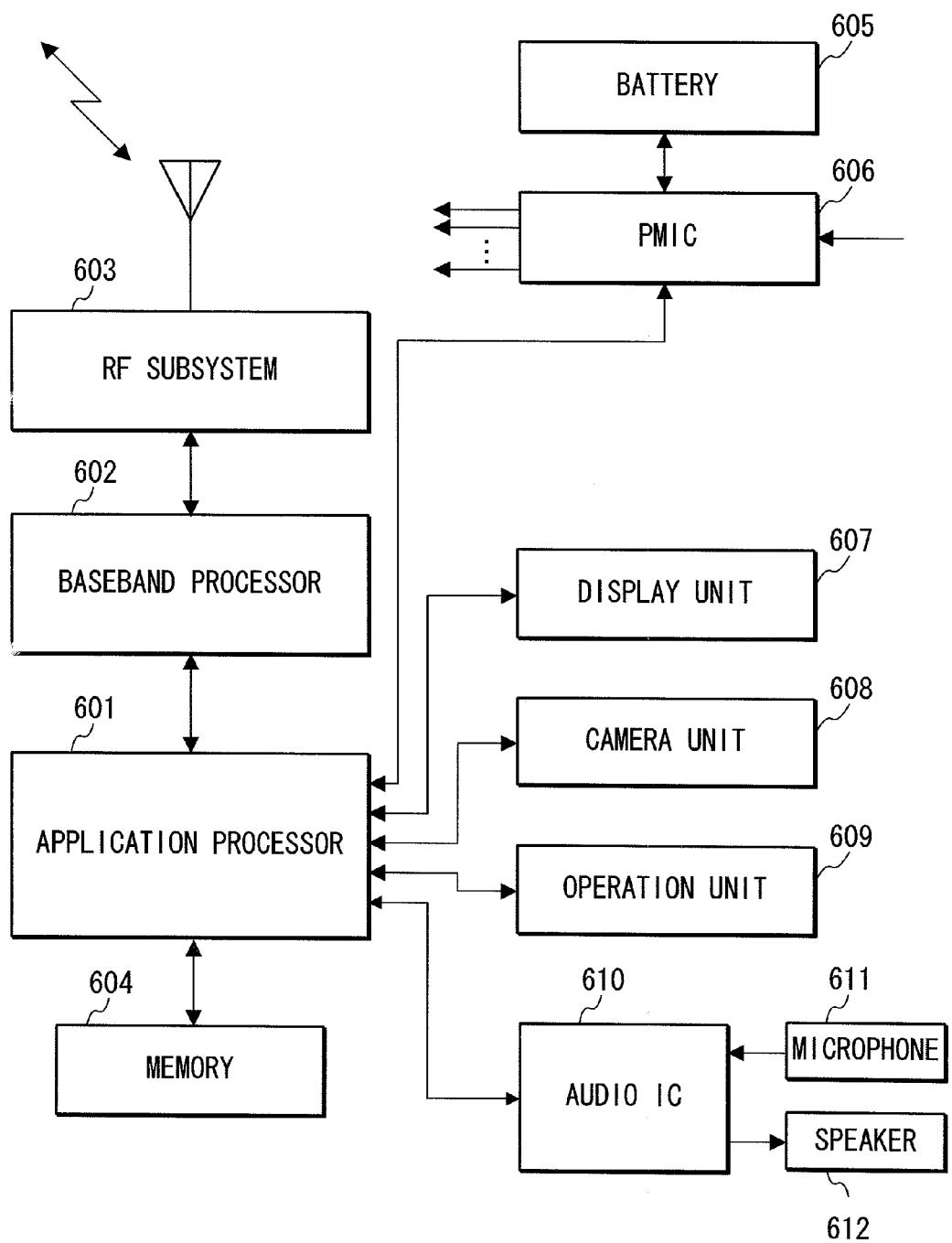
FIG. 2 is a block diagram showing the configuration example of the radio communication terminal according to the first embodiment.

Next, with reference to FIG. 2, there will be described an internal configuration of the radio communication terminal 500. As shown in FIG. 2, the radio communication terminal 500 includes an application processor 601, a baseband processor 602, an RF (Radio Frequency) subsystem 603, a memory 604, a battery 605, a PMIC (Power Management Integrated Circuit) 606, a display unit 607, a camera unit 608, an operation unit 609, an audio IC 610, a microphone 611, and a speaker 612.

The application processor 601 reads a program stored in the memory 604 and performs various processes to implement various functions of the radio communication terminal 500. For example, the application processor 601 executes an OS (Operating System) program stored in the memory 604 and also executes application programs that are executed on this OS program.

The baseband processor 602 performs a baseband process including an encoding process (e.g., error correction coding such as convolution coding and turbo coding) or a decoding process for data to be transmitted/received by the radio communication terminal 500. Specifically, the baseband processor 602 performs the baseband process for transmission data input from the application processor 601, and outputs to the RF subsystem 603 a baseband signal obtained by the baseband process. Further, the baseband processor 602 performs the baseband process for a base band signal input from the RF subsystem 603, and outputs to the application processor 601 reception data obtained by the baseband process.

The RF subsystem 603 performs modulation and frequency conversion for the baseband signal, frequency conversion and demodulation for an RF signal, and the like. Specifically, the RF subsystem 603 modulates the baseband signal input from the baseband processor 602 to obtain a modulated signal (IF (Intermediate Frequency) signal), and performs the frequency conversion for the modulated signal to obtain the RF signal. Then, the RF subsystem 603 transmits the RF signal through an antenna. Further, the RF subsystem 603 performs the frequency conversion and the demodulation for the RF signal received through the antenna, and outputs to the baseband processor 602 the baseband signal obtained by these frequency conversion and demodulation.

The memory 604 stores programs and data used by the application processor 601. Further, the memory 604 includes a nonvolatile memory which retains stored data even when the power supply is cut off, and a volatile memory in which stored data is cleared when the power supply is cut off.

The battery 605 is a battery and is used when the radio communication terminal 500 operates without using the external power supply. Note that the radio communication terminal 500 may use the battery 605 even when the external power supply is connected. Further, it is preferable that a secondary battery is used as the battery 605.

The PMIC 606 generates an internal power supply from the battery 605 or the external power supply. This internal power supply supplies electric power to each block of the radio communication terminal 500. At this time, the PMIC 606 controls the voltage of the internal power supply for each of the blocks which receive the internal power supply. This voltage control is performed under instructions from the application processor 601. Further, the PMIC 606 can also control whether the internal power supply is supplied or cut off for each of the blocks. Furthermore, the PMIC 606 controls the charging to the battery 605 when the external power supply is supplied.

The display unit 607 corresponds to the display device 502 shown in FIG. 1A, and displays various images and information in accordance with instructions from the application processor 601. The images displayed in the display unit 607 include user interface images for prompting the user to operate the radio communication terminal 500, still images, moving images, and the like.

The camera unit 608 corresponds to the camera device 505 shown in FIG. 1A and the camera device 506 shown in FIG. 1B, and obtains a still image or a moving image in accordance with instructions from the application processor 601.

The operation unit 609 corresponds to the touch panel 503 and the operation buttons 504 shown in FIG. 1A, and serves as a user interface for the user providing operation instructions to the radio communication terminal 500.

The audio IC 610 decodes audio data input from the application processor 601 and thereby drives the speaker 612. Further, the audio IC 610 encodes audio information obtained from the microphone 611, and outputs to the application processor 601 audio data obtained by the encoding.

Figure 3:
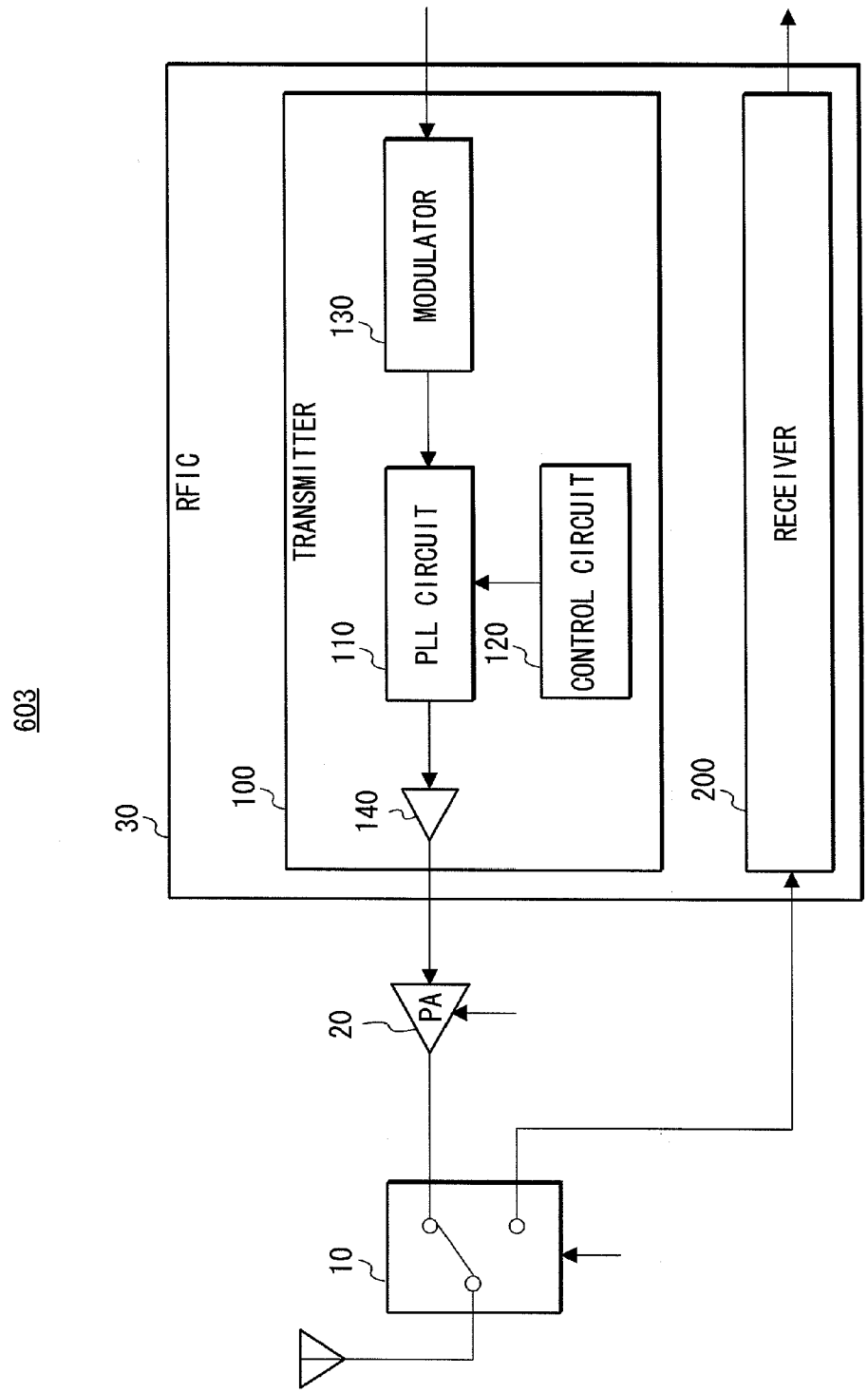
FIG. 3 is a block diagram showing a configuration example of an RF subsystem according to the first embodiment.

Next, there will be described a specific configuration example of the above-mentioned RF subsystem 603. Taking as an example a case where the radio communication terminal 500 employs TDD (Time Division Duplex) method as a communication method, it is preferable that the RF subsystem 603 is configured as shown in FIG. 3. In this case, the RF subsystem 603 includes an antenna switch 10, a PA (Power Amplifier) 20, and an RFIC (Radio Frequency Integrated Circuit) 30.

The antenna switch 10 exclusively selects one of a state where an RF signal output from the RFIC 30 is propagated to an antenna and a state where an RF signal received through the antenna is propagated to the RFIC 30, in accordance with, for example, instructions from the above-mentioned baseband processor 602 (or RFIC 30). The PA 20 amplifies the RF signal output from the RFIC 30 and propagates the amplified RF signal to the antenna switch 10 in accordance with, for example, instructions from the above-mentioned baseband processor 602 (or RFIC 30).

Further, the RFIC 30 includes a transmitter 100 serving as a semiconductor device according to this embodiment, and a receiver 200.

Among them, the receiver 200 performs frequency conversion and demodulation for the RF signal input from the antenna switch 10, and outputs to the above-mentioned baseband processor 602 a baseband signal obtained by these frequency conversion and demodulation.

On the other hand, the transmitter 100 includes a PLL circuit 110, control circuit 120, a modulator 130, and a buffer 140.

The PLL circuit 110 is a so-called offset PLL, and performs frequency conversion with a modulated signal output from the modulator 130, thereby outputting the RF signal. The RF signal output from the PLL circuit 110 is propagated to the PA 20 through the buffer 140.

The control circuit 120 generates a control signal as will be described later, thereby controlling the PLL circuit 110.

The modulator 130 employs as a modulation method, for example, GMS (Gaussian-filtered Minimum Shift Keying) which is one of frequency modulation techniques. In this case, the modulator 130 outputs to the PLL circuit 110 a frequency in accordance with variation in the baseband signal input from the above-mentioned baseband processor 602. Specifically, before the modulation, the modulator 130 smoothes the baseband signal (digital signal) by use of a filter having Gaussian characteristics. Then, the modulator 130 outputs to the PLL circuit 110 a value of a central frequency (carrier frequency) and a value of an offset frequency from the central frequency, which chances depending on variation in the smoothed digital signal. In the following description, the value of the central frequency and the value of the offset frequency are sometimes referred to as "Frequency" and "Modulation" respectively.

Note that the PLL circuit 110 can be used as not only the offset PLL but also a local oscillator. In the latter case, the PLL circuit 110 may oscillate a carrier frequency, and the modulator 130 may generate an IF signal by amplitude modulation, phase modulation and the like. Then, these carrier frequency and IF signal may be used for frequency conversion by a mixer or the like.

Next, there will be described specific configuration example and operation example of the PLL circuit 110. Meanwhile, as the premise of this description, there are described problems in typical PLL circuits, which have been found in studies by the inventors of this application.

Figure 4:
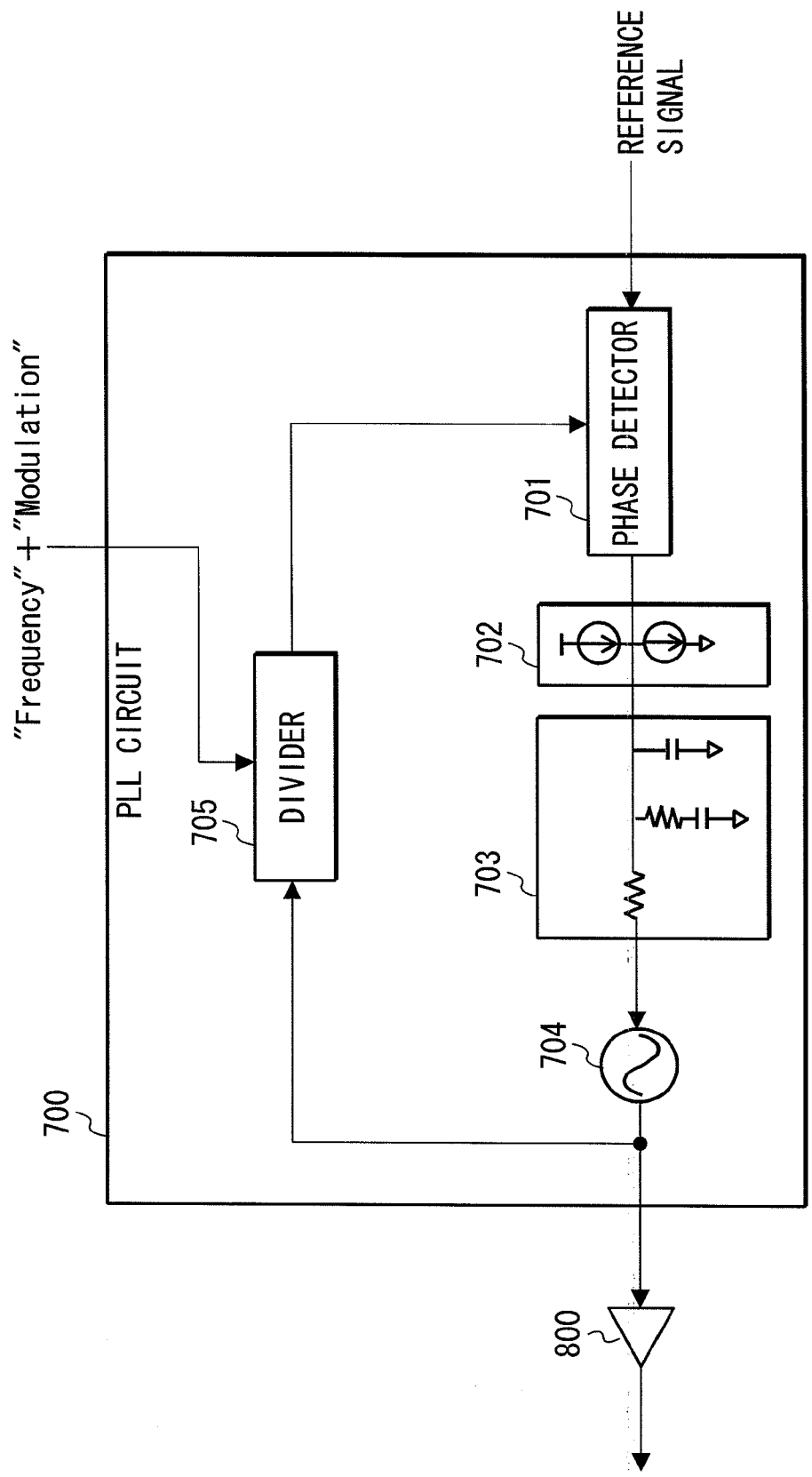
FIG. 4 is a block diagram showing a configuration of a PLL circuit according to a comparison example.

FIG. 4 shows, as a comparison example, a configuration of a typical PLL circuit mounted on a GMSK-compatible radio communication terminal. A PLL circuit 700 shown in FIG. 4 is an analog-type fractional PLL and includes a phase detector 701, a charge pump 702, a loop filter 703, a VCO (Voltage Controlled Oscillator) 704, and a divider 705. At the time of data transmission in the radio communication terminal, a frequency of a modulated signal ("Frequency"+"Modulation") is input to the divider 705. Further, an output terminal of the PLL circuit 700 is connected to the subsequent PA (not shown) through a buffer 800.

Figure 5:
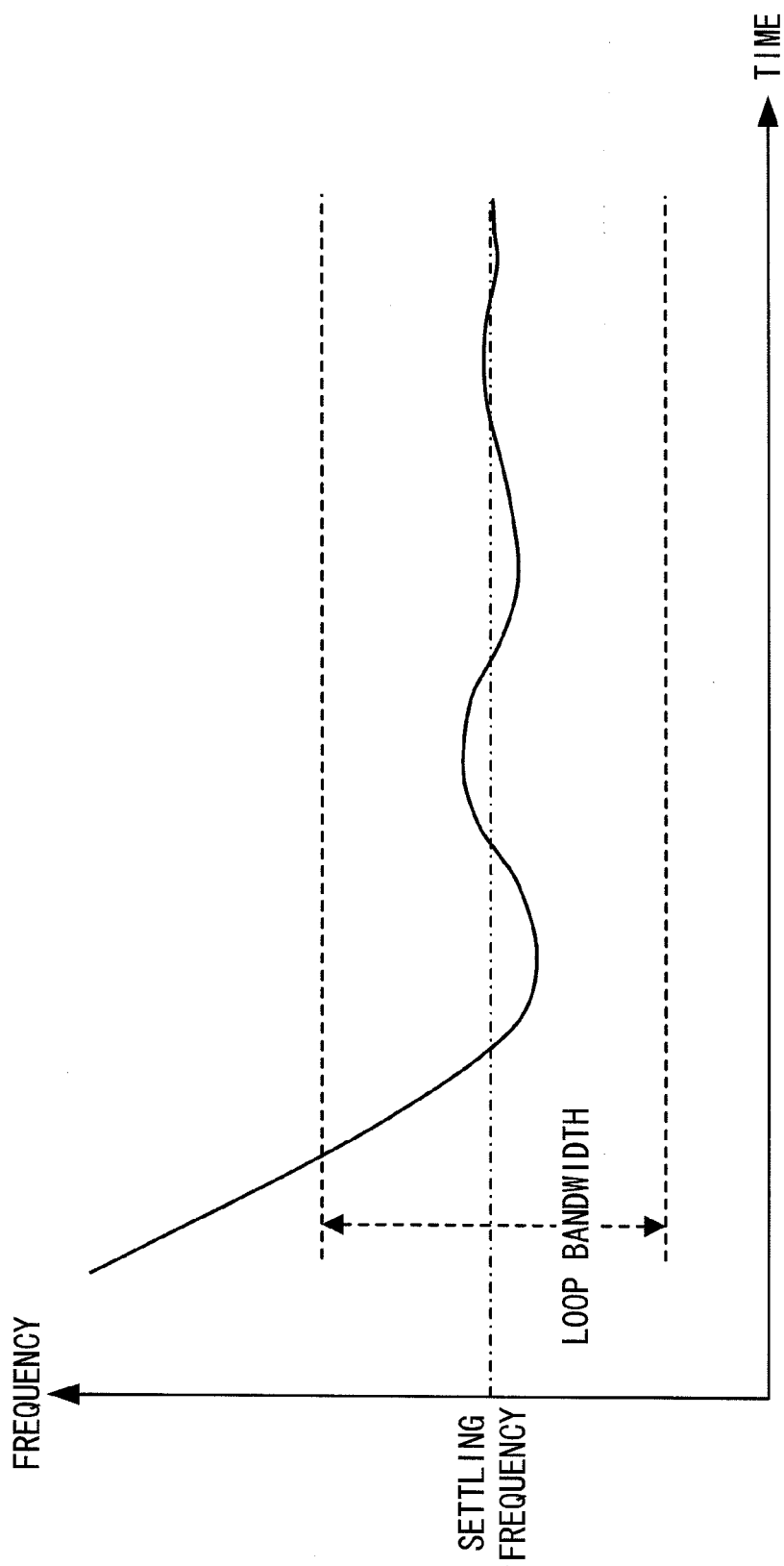
FIG. 5 is a graph showing an example where an oscillation frequency converges in the PLL circuit.

In the initial operation, the divider 705 divides a frequency of an output signal of the VCO 704 and outputs the obtained signal to the phase detector 701. The phase detector 701 detects a phase difference between the signal input from the divider 705 and a reference signal. Then, the phase detector 701 generates the voltage in accordance with the detected phase difference. The charge pump 702 changes its output voltage in accordance with variation in the voltage output from the phase detector 701. The voltage output from the charge pump 702 is applied to the VCO 704 after its high-frequency components are reduced by the loop filter 703. Thus, an oscillation frequency of the VCO 704 converges on a certain value. FIG. 5 shows an example of this convergence.

After that, when the buffer 800 is turned on, an output signal of the buffer 800 is coupled to the VCO 704. At this time, the oscillation frequency of the VCO 704 fluctuates due to influence of the coupling. Therefore, the PLL circuit 700 operates in such a manner that the oscillation frequency of the VCO 704 converges again.

However, a time from when the buffer 800 is turned on to when the data transmission is started in the radio communication terminal is much shorter than a time required for the above-mentioned initial operation. Accordingly, there has been a problem in the typical PLL circuit that the re-convergence of the oscillation frequency is not completed in time for the timing of data transmission, so that transmission characteristics of the radio communication terminal are markedly deteriorated.

It is possible to shorten a lockup time of the PLL circuit (time required for the convergence of the oscillation frequency) by broadening the loop bandwidth. However, the broadening of the loop bandwidth causes a problem that spectrum characteristics are deteriorated due to phase noises. On the other hand, in a case of narrowing the loop bandwidth in terms of the spectrum characteristics, the lockup time cannot be shortened at all.

As one of other methods, there can be considered a method of broadening the loop bandwidth at the period of the initial operation in the PLL circuit and then of narrowing the loop bandwidth. In the case of using this method, it can be expected to keep shortening the lockup time while ensuring the spectrum characteristics.

Figure 6:
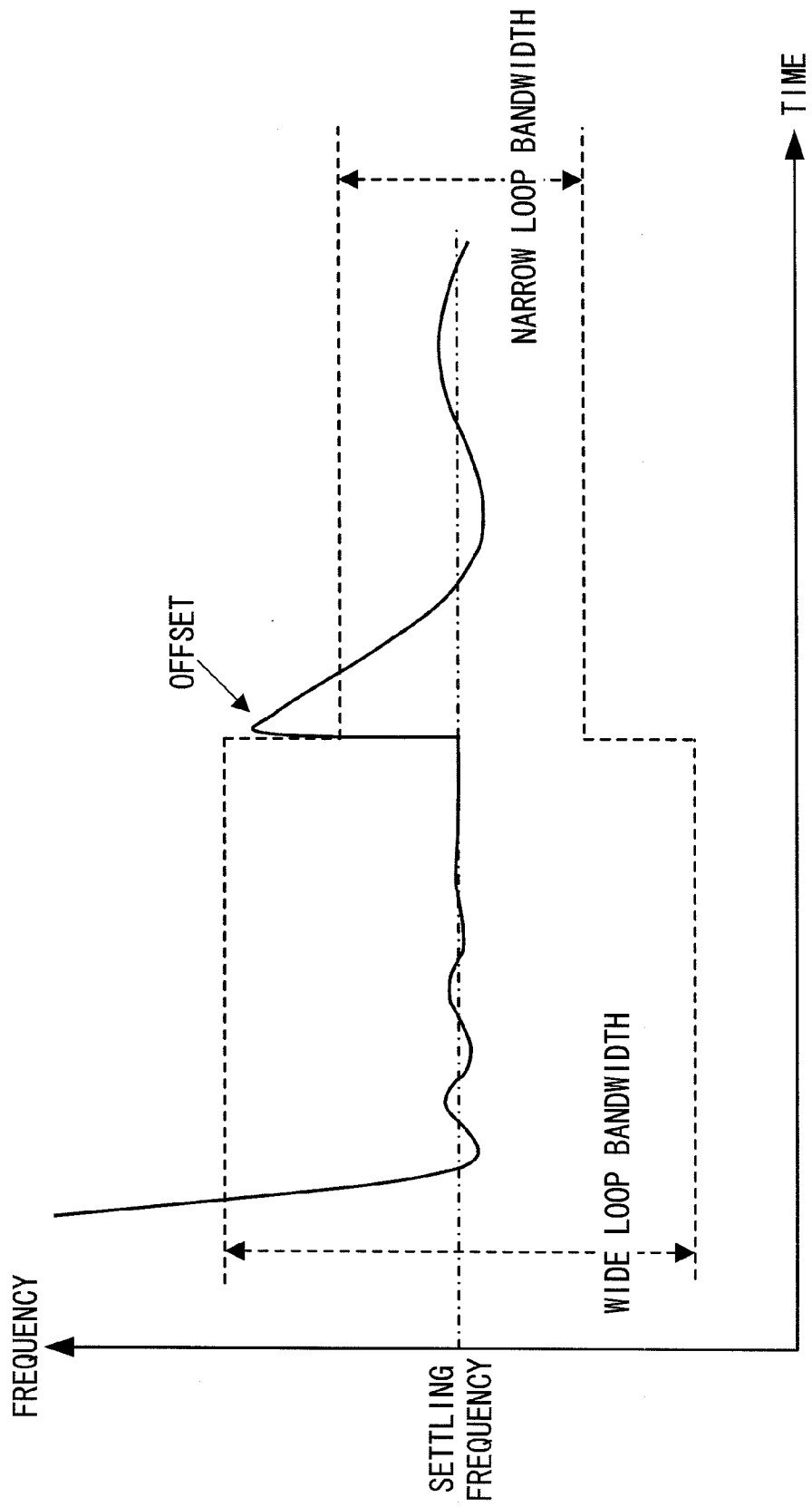
FIG. 6 is a graph for explaining problems which occur upon switching a loop bandwidth.

However, simple switching of the loop bandwidth causes another problem that the lockup time cannot be shortened. This is because as shown in FIG. 6, the offset (fluctuation of the oscillation frequency) occurs due to rapid change in a loop gain (to be more precise, the input voltage to the VCO) upon switching the loop bandwidth, so that the lockup time is extended.

Note that Japanese Unexamined Patent Application Publication No. 2010-34618 discloses the PLL circuit which compensates such an offset. However, there is a problem in Japanese Unexamined Patent Application Publication No. 2010-34618 that the size of PLL circuit increases. This is because it is necessary to place complicated circuits for detecting and compensating the offset.

Therefore, the inventors of this application have found a configuration for compensating the offset occurring upon switching the loop bandwidth while preventing the circuit size from increasing. Hereinafter, this configuration will be described in detail with reference to FIG. 7.

Figure 7:
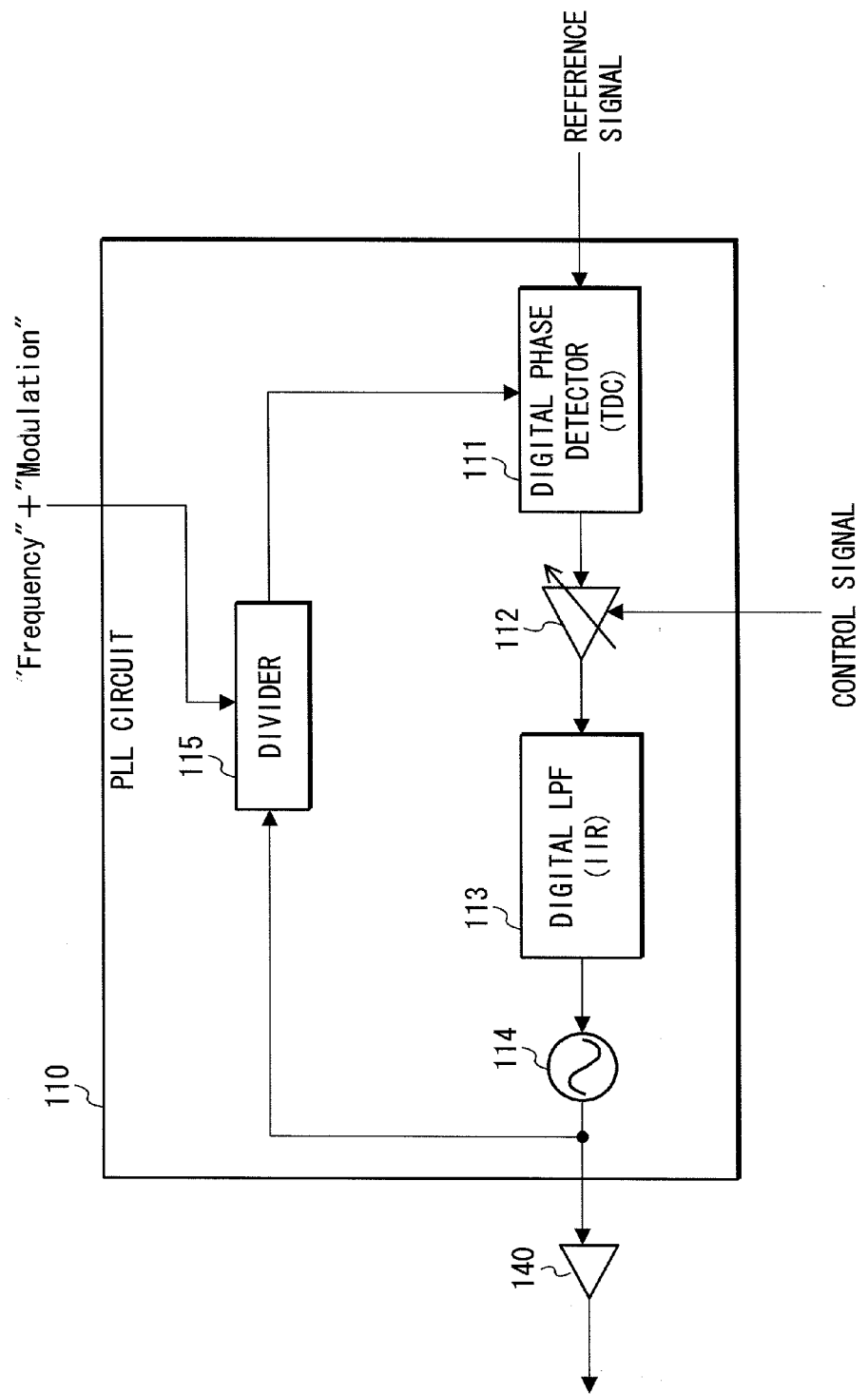
FIG. 7 is a block diagram showing a configuration example of a PLL circuit according to the first embodiment.

As shown in FIG. 7, a PLL circuit 100 according to this embodiment is an ADPLL (All Digital PLL) circuit which is configured to include a digital phase detector 111, a variable gain amplifier 112, a digital LPF (Low Pass Filter) 113, a DCO (Digitally Controlled Oscillator) 114, and a divider 115.

The digital phase detector 111 is configured by use of, for example, a TDC (Time to Digital Converter), and detects a phase difference between a feedback signal obtained by feeding back an output signal of the DCO 114 and a reference signal. Further, the digital phase detector 111 outputs, as a digital signal, a phase difference value indicating a value in accordance with the detected phase difference.

The variable gain amplifier 112 amplifies the digital signal output from the digital phase detector 111 at a gain in accordance with the control signal from the above-mentioned control circuit 120. Specifically, the variable gain amplifier 112 is configured by use of, for example, a shift operation unit, and performs left or right bit shift operations for the digital signal, thereby switching a loop gain of the PLL circuit 100. The loop gain is in proportion to the loop bandwidth. Therefore, a loop bandwidth of the PLL circuit 100 can be controlled by switching the gain at the variable gain amplifier 112.

The digital LPF 113 is a digital filter such as an IIR (Infinite Impulse Response) filter or an FIR (Finite Impulse Response) filter, and smoothes variation in the digital signal output from the variable gain amplifier 112.

The DCO 114 controls an oscillation frequency in accordance with a value of the digital signal smoothed by the digital LPF 113. Further, an output terminal of the DCO 114 is connected to the PA 20 (see FIG. 3) through a buffer 140.

The frequency of the modulated signal ("Frequency"+ "Modulation") is input from the modulator 130 (see FIG. 3) to the divider 115 at the time of data transmission in the radio communication terminal 500 (see FIGS. 1A, 1B and 2). The divider 115 divides a frequency of the output signal of the DCO 114 at a division ratio in accordance with the frequency of the modulated signal, and outputs the obtained signal to the digital phase detector 111. Thus, the PLL circuit 110 operates as a frequency converter, thereby outputting an RF signal in accordance with the modulation in the modulator 130. Note that the PLL circuit 110 can operate as a local oscillator. In this case, the divider 115 may divides the frequency of the output signal of the DCO 114 at a predetermined division ration in accordance with the carrier frequency.

Note that it is not essential to place the divider 115, and the digital phase detector 111 may compare the phase of the output signal of the DCO 114 directly with the phase of the reference signal. Further, in a case where the modulation bandwidth is broader than a cutoff frequency of the digital LPF 113, it is preferable that Pre-distortion is performed for the modulated signal at the modulator 130, or the modulated signal is added to the output of the digital LPF 113.

Next, a specific operation example of this embodiment will be described with reference to FIGS. 8 and 9.

Figure 8:
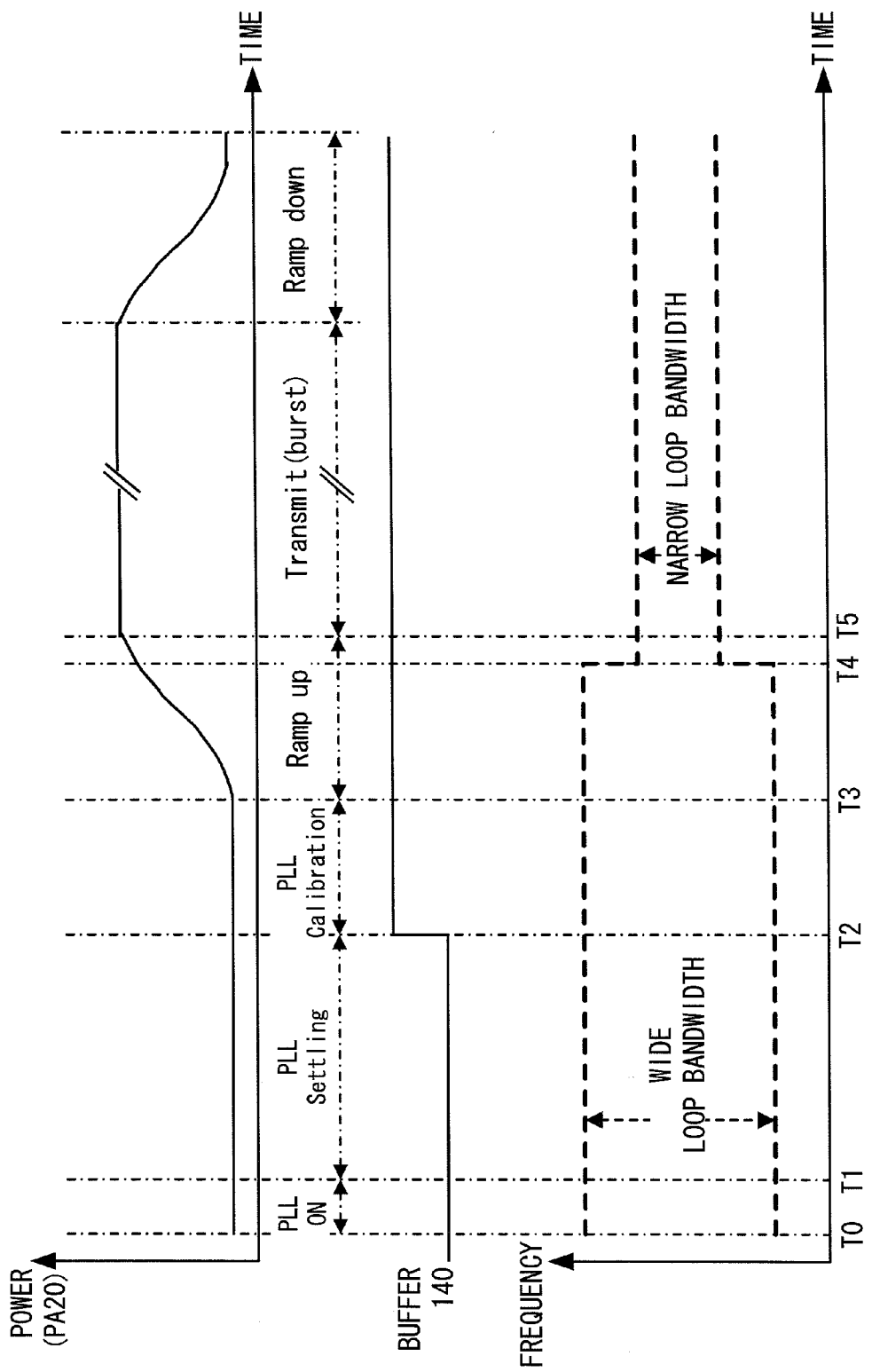
FIG. 8 is a diagram showing an operation example of the PLL circuit according to the first embodiment.

As shown in FIG. 8, at a time T0, the respective blocks in the PLL circuit 110 are firstly booted up. At this time, the loop bandwidth of the PLL circuit 110 is set to a broader one so as to adequately achieve the effect to shorten the lockup time. In other words, the gain of the variable gain amplifier 112 is set to higher one.

Then, at a time T1, the PLL circuit 110 starts initial operations (Settling) in which the oscillation frequency of the DCO 114 converges on a certain value. Specifically, the divider 115 divides the frequency of the output signal of the DCO 114 at a division ratio in accordance with the central frequency ("Frequency"), and outputs the obtained signal to the digital phase detector 111. The digital phase detector 111 detects a phase difference between the signal output from the divider 114 and the reference signal. Then, the digital phase detector 111 generates a digital signal in accordance with the detected phase difference. The variable gain amplifier 112 amplifies the digital signal output from the digital phase detector 111, and provides the amplified signal to the DCO 114 through the digital LPF 113. These processes are repeatedly performed, so that the oscillation frequency of the DCO 114 converges on the certain value.

After that, when the buffer 140 is turned on at a time T2, an output signal of the buffer 104 is coupled to the DCO 114. Due to influence of this coupling, the oscillation frequency of the DCO 114 fluctuates. Therefore, the PLL circuit 110 performs operations (Calibration) such that the oscillation frequency of the DCO 114 converges again. At this time, the loop bandwidth of the PLL circuit 110 has been set to the broader one, and therefore the oscillation frequency of the DCO 114 converges again at high speed.

In parallel with that, at a time T3, the RF subsystem 603 performs operations (Ramp up) in which a gain of the PA 20 is gradually raised in advance to the data transmission (Transmit) start. Note that when the data transmission is completed, the RF subsystem 603 performs operations (Ramp down) in which the gain of the PA 20 is gradually ramped down.

On the other hand, the control circuit 120 generates the control signal at a time T4 which is earlier by a predetermined time than a time T5 when the data transmission is started, thereby instructing the variable gain amplifier 112 to lower its gain. The gain of the variable gain amplifier 112 is switched so as to set the loop bandwidth of the PLL circuit 110 to a narrower one, so that it is possible to prevent the spectrum characteristics from being deteriorated. Further, it is preferable that the time T4 when the gain is switched is closer to the time T5 when the data transmission is started. This is because the oscillation frequency can converge at high speed within the broader loop bandwidth, even when the oscillation frequency of the DCO 114 fluctuates due to the coupling of the output signal of the PA 20 to the DCO 114. Note that the control circuit 120 can easily detect the coming of the time T4 for the switching. The control circuit 120 measures with e.g., a timer that a predetermined time has elapsed from the time T0 when the PLL circuit 110 is booted up, and detects the elapse of this predetermined time as the coming of the time T4 for the switching.

Figure 9:
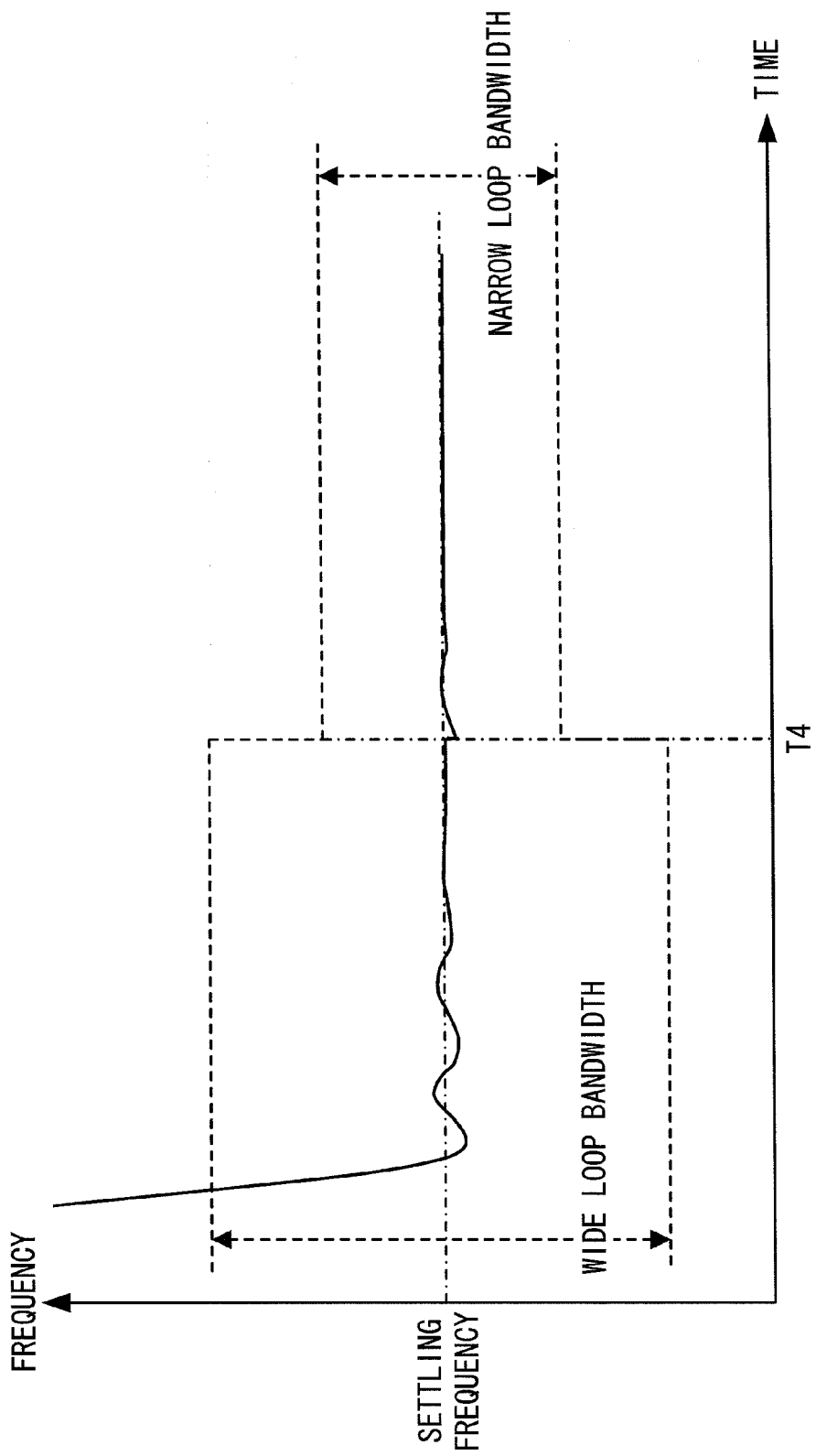
FIG. 9 is a graph showing an example where an oscillation frequency converges in the PLL circuit according to the first embodiment.

FIG. 9 shows an example of changes of the oscillation frequency of the DCO 114 at around the time T4 for the switching.

At the period before the time T4, the loop bandwidth is set to the broader one. Therefore, the oscillation frequency of the DCO 114 converges at high speed, even when it fluctuates due to the influence of coupling.

At the time T4, the gain of the variable gain amplifier 112 is switched, so that the digital signal output from the variable gain amplifier 112 fluctuates. However, the digital LPF 113 smoothes this signal fluctuation (in other words, the digital LPF 113 adequately suppresses unnecessary high-frequency components associated with the switching of the gain). Therefore, the input signal to the DCO 114 varies slowly, so that the occurrence of offset is prevented as shown in FIG. 9.

At the period after the time T4, the loop bandwidth is set to the narrower one. Therefore, it is possible to prevent the spectrum characteristics from being deteriorated upon the data transmission. Further, since the occurrence of offset is prevented, the oscillation frequency of the DCO 114 converges again in time for the timing of data transmission Thus, in this embodiment, it is possible for the simple configuration shown in FIG. 7 to compensate the offset occurring upon switching the loop bandwidth. Accordingly, this embodiment can contribute to the reduction in the circuit size and the chip area. Further, this embodiment is suitable for high-speed processing and particularly for being mounted on a radio communication terminal, because it is not necessary even to detect the offset.

Second Embodiment

Figure 10:
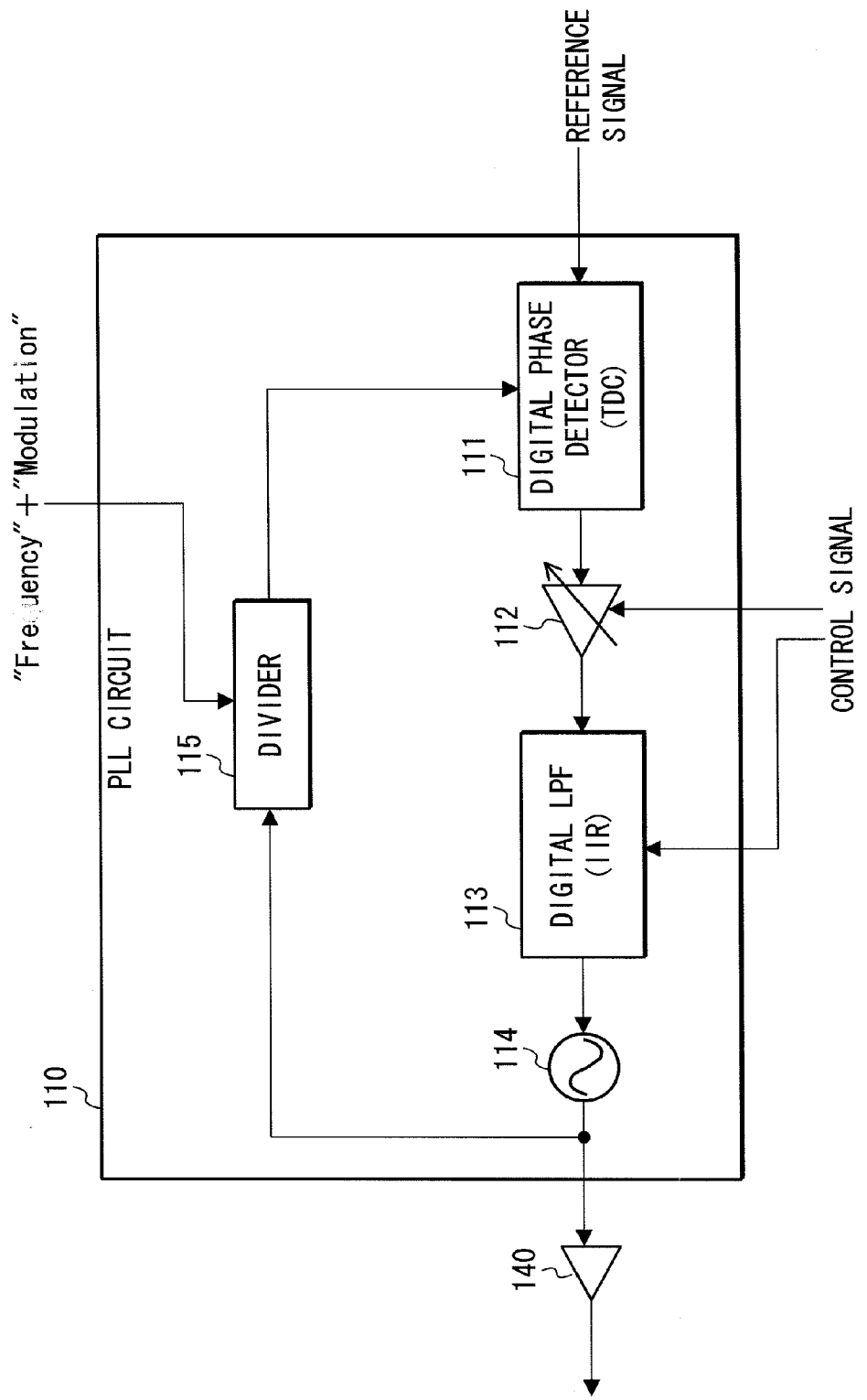
FIG. 10 is a block diagram showing a configuration example of a PLL circuit according to a second embodiment of the present invention.

A radio communication terminal according to this embodiment can be configured as with that of the above-mentioned first embodiment. Meanwhile, a semiconductor device according to this embodiment is different from that of the above-mentioned first embodiment in that as shown in FIG. 10, a cutoff frequency of the digital LPF 113 forming the PLL circuit 110 can be switched in accordance with the control signal from the above-mentioned control circuit 120. Note that in the case where the digital LPF 113 is configured by use of the IIR filter, the FIR filter or the like, it is possible to easily switch the cutoff frequency by changing filter coefficients.

In the operation, the control circuit 120 generates the control signal at the time T4 for the switching shown in FIG. 8, thereby instructing the variable gain amplifier 112 to lower the gain and instructing the digital LPF 113 to lower the cutoff frequency. Note that the variable gain amplifier 112 and the digital LPF 113 do not necessarily have to be controlled at exactly the same timing.

Thus, the digital LPF 113 further suppresses unnecessary high-frequency components associated with the switching of the gain at the variable gain amplifier 112. Therefore, the variation in the input signal to the DCO 114 is smoothed even further, so that it is possible to more reliably prevent the occurrence of offset upon switching the loop bandwidth compared to the above-mentioned first embodiment. Further, in this embodiment, the cutoff frequency of the digital LPF 113 is lowered, so that it is possible to achieve the effect to improve the spectrum characteristics upon the data transmission.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a phase detector that detects a phase difference between a feedback signal and a reference signal and generates a phase difference value indicating a value in accordance with the phase difference, the feedback signal being obtained by feeding back an output signal;
an amplifier that amplifies the phase difference value at a gain determined in accordance with an external control signal;
a filter that smoothes an output value of the amplifier;
an oscillator that controls a frequency of the output signal in accordance with an output value of the filter; and
a control circuit that generates, at a predetermined timing, the control signal to instruct the amplifier to switch the gain so to be lower than a gain at time when the device is booted up, and to instruct the filter to switch a cutoff frequency of the filter so as to be lower than a cutoff frequency at the time when the device is booted up,
wherein said cutoff frequency is determined in accordance with the control signal, and
wherein the timing is set to be earlier, by a predetermined time, than a timing at which data transmission is started in a radio communication terminal in which the device is mounted.

2. The semiconductor device according to claim 1, further comprising:
a divider that divides, at a division ratio in accordance with a frequency of a modulated signal, a frequency of the feedback signal to be output to the phase detector.

3. The semiconductor device according to claim 2, further comprising:
a modulator that outputs, as the frequency of the modulated signal, a frequency in accordance with variation in an input baseband signal to the divider.

4. A radio communication terminal mounting the semiconductor device according to claim 1.

5. A semiconductor device comprising:
a phase detector that detects a phase difference between a feedback signal and a reference signal and generates a phase difference value indicating a value in accordance with the phase difference, the feedback signal being obtained by feeding back an output signal;
an amplifier that amplifies the phase difference value at a gain determined in accordance with an external control signal;
a filter that smoothes an output value of the amplifier;
an oscillator that controls a frequency of the output signal in accordance with an output value of the filter; and
a control circuit that generates, at a predetermined timing, the control signal to instruct the amplifier to switch the gain so as to be lower than a gain at a time when the device is booted up,
wherein the timing is set to be earlier, by a predetermined time, than a timing at which data transmission is started in a radio communication terminal in which the device is mounted.

6. The semiconductor device according to claim 5, further comprising:
a divider that divides, at a division ratio in accordance with a frequency of a modulated signal, a frequency of the feedback signal to be output to the phase detector.

7. The semiconductor device according to claim 6, further comprising:
a modulator that outputs, as the frequency of the modulated signal, a frequency in accordance with variation in an input baseband signal to the divider.

8. A radio communication terminal mounting the semiconductor device according to claim 5.

* * * * *